US008255858B2

(12) United States Patent
Huang et al.

(10) Patent No.: US 8,255,858 B2
(45) Date of Patent: Aug. 28, 2012

(54) METHOD FOR ADJUSTING CAPACITANCE OF CAPACITORS WITHOUT AFFECTING DIE AREA

(75) Inventors: Peter Huang, Temple City, CA (US); Ming-Chun Chen, Newport Coast, CA (US)

(73) Assignee: Broadcom Corporation, Irvine, CA (US)

( * ) Notice: Subject to any disclaimer, the term of this patent is extended or adjusted under 35 U.S.C. 154(b) by 781 days.

(21) Appl. No.: 12/315,122

(22) Filed: Nov. 26, 2008

(65) Prior Publication Data

US 2010/0125989 A1     May 27, 2010

(51) Int. Cl.
    *G06F 17/50*     (2006.01)
    *H01L 21/20*     (2006.01)
    *H01L 27/108*     (2006.01)
    *H01L 29/12*     (2006.01)
    *H01L 29/786*     (2006.01)
    *H01L 29/94*     (2006.01)
    *H01L 21/338*     (2006.01)
    *H01L 21/337*     (2006.01)
    *H01L 21/8242*     (2006.01)

(52) U.S. Cl. ............ 716/132; 257/68; 257/71; 257/303; 438/171; 438/190; 438/253; 438/381; 438/387; 438/396

(58) Field of Classification Search .................... 257/68, 257/71, 303; 438/171, 190, 253, 381, 387, 438/396; 716/132
See application file for complete search history.

(56) References Cited

U.S. PATENT DOCUMENTS 5,173,864 A * 12/1992 Watanabe et al. ............. 716/114
2005/0236690 A1 * 10/2005 Chung ........................ 257/532
2009/0207552 A1 * 8/2009 Frederick et al. .......... 361/306.2

OTHER PUBLICATIONS

Su et al.; "Optimal Decoupling Capacitor Sizing and Placement for Standard Cell Layout Designs"; Apr. 2003; IEEE Transactions on Computer-Aided Design of Integrated Circuits and Systems, vol. 22, No. 4; pp. 1-9.*

* cited by examiner

*Primary Examiner* — Suresh Memula
(74) *Attorney, Agent, or Firm* — Farjami & Farjami LLP

(57) ABSTRACT

According to one exemplary embodiment, a method for adjusting geometry of a capacitor includes fabricating a first composite capacitor residing in a first standard cell with a first set of process parameters. The method further includes using a second standard cell having substantially same dimensions as the first standard cell. The method further includes using a capacitance value from the first composite capacitor to adjust a geometry of a second composite capacitor residing in the second standard cell, wherein the second composite capacitor is fabricated with a second set of process parameters. The geometry of the second composite capacitor can be adjusted to cause the second composite capacitor to have a capacitance value substantially equal to the capacitance value from the first composite capacitor.

19 Claims, 6 Drawing Sheets

METHOD FOR ADJUSTING CAPACITANCE OF CAPACITORS WITHOUT AFFECTING DIE AREA

BACKGROUND OF THE INVENTION

1. Field of the Invention

The present invention is generally in the field of semiconductors. More specifically, the present invention is in the field of fabrication of capacitors in semiconductor wafers.

2. Background Art

Various types of capacitors, such as composite capacitors comprising several interconnected capacitors, are used in circuits in semiconductor devices, such as mixers and amplifiers, and are required to provide high capacitance density without consuming a large area on a semiconductor die (also referred to simply as a "die"). A composite capacitor can include multiple stacked layers, where each layer of the capacitor can reside in a different metal layer of a die and be electrically connected to other capacitor layers by vias. During a typical design cycle, a circuit layout design including a capacitor, such as a composite capacitor, can be verified by fabricating the circuit including the capacitor in a small-scale engineering or pilot foundry. After the layout design has been verified, the circuit including the capacitor can be mass produced in a production foundry to reduce manufacturing cost.

However, for a variety of reasons, the process parameters utilized to fabricate a capacitor in one foundry may not match the process parameters utilized to fabricate the capacitor in another foundry, thereby causing the capacitor to have a different capacitance value in each foundry. For example, a process parameter, such as a dielectric constant value of a dielectric material, can be higher in a production foundry as compared with the dielectric constant in a small-scale engineering foundry. As a result, the capacitance value of the capacitor needs to be adjusted in the production foundry to match the capacitance value of the capacitor in the small-scale engineering foundry.

In a conventional approach, the layout of the capacitor can be manually redesigned to cause the capacitance value of the capacitor in the production foundry to match the capacitance value of the capacitor in the small-scale engineering foundry. However, manually redesigning the layout of the capacitor can undesirably increase manufacturing cost and requires the data files, such as such as Graphic Data System (GDS) data files including the layout of the capacitor, to be regenerated for "tape-out" to the production foundry. Moreover, according to conventional approaches, redesigning the capacitor layout usually causes an undesirable change in the die area consumed by the capacitor.

SUMMARY OF THE INVENTION

A method for adjusting capacitance of capacitors without affecting die area substantially as shown in and/or described in connection with at least one of the figures, as set forth more completely in the claims.

DETAILED DESCRIPTION OF THE INVENTION

The present invention is directed to a method for adjusting capacitance of capacitors without affecting die area. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1:
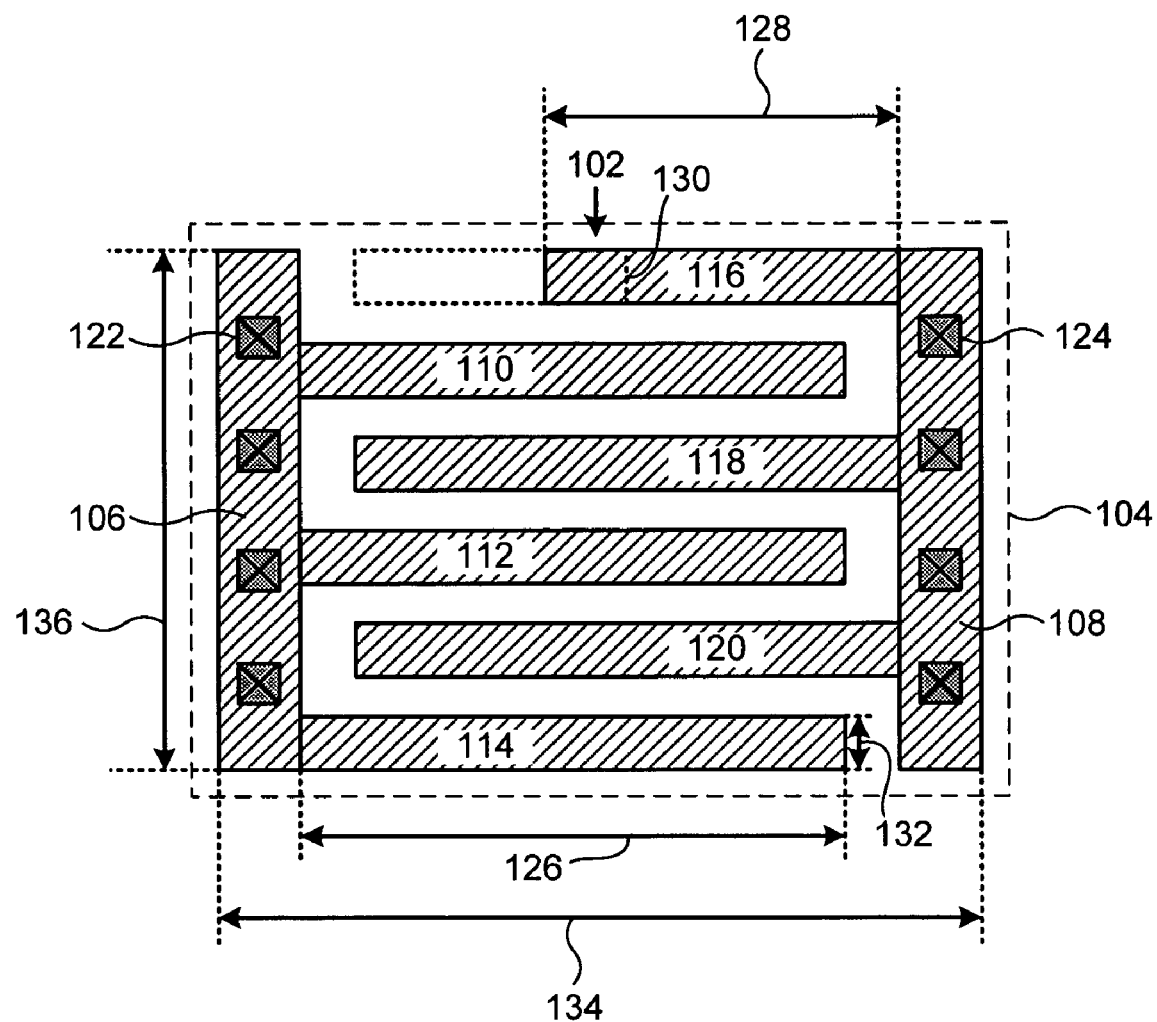
FIG. 1 shows a top view of an exemplary capacitor in an exemplary standard cell in accordance with one embodiment of the present invention.

FIG. 1 shows a top view of capacitor 102 in standard cell 104 in accordance with one embodiment of the present invention. Capacitor 102, which can be a composite capacitor comprising several interconnected capacitors, includes conductive segments 106 and 108 and conductive fingers 110, 112, 114, 116, 118, and 120 (hereinafter "conductive fingers 110 through 120"). In FIG. 1, capacitor 102 resides in standard cell 104, which can be repeated in multiple metal layers in die to form a composite capacitor having multiple stacked capacitor layers. For example, standard cell 104 can be repeated in a first metal layer (i.e. M1), a second metal layer (i.e. M2), and so forth to form a composite capacitor having multiple stacked layers. Each of the stacked layers of capacitor 102 can be substantially identical in geometry, orientation, and dimensions. For example, if conductive finger 114 is situated in a third metal layer (i.e. M3) in the die, conductive finger 114 can be situated directly above and in alignment with a corresponding conductive finger in M2 and/or situated directly below and in alignment with a corresponding conductive finger in a fourth metal layer (i.e. M4) in the die. In an embodiment of the invention in which capacitor 102 is situated in a die having seven metal layers, for example, standard cell 104 can be repeated in M1, M2, M3, M4, a fifth metal layer (i.e. M5), a sixth metal layer (i.e. M6), and the seventh metal layer (i.e. M7) in the die. In one embodiment, standard cell 104 can be repeated horizontally in one metal layer of a semiconductor die to form a single layer composite capacitor. Capacitor 102 can be utilized in mixers, amplifiers, or other semiconductor devices that utilize analog circuits. However, capacitor 102 can be generally utilized in any semiconductor device that utilizes a capacitor.

As shown in FIG. 1, conductive fingers 110, 112, and 114 are electrically connected to connective segment 108, conductive fingers 116, 118, and 120 are electrically connected to conductive segment 108, and conductive fingers 110, 112, and 114 are interlaced with conductive fingers 116, 118, and 120. One electrode of capacitor 102 can include conductive segment 106 and conductive fingers 110, 112, and 114 and another electrode of capacitor 102 can include conductive segment 108 and conductive fingers 116, 118, and 120. In the embodiment in FIG. 1, capacitor 102 includes three conductive fingers electrically connected to each conductive segment. In other embodiments, capacitor 102 can include more than three or less than three conductive fingers electrically connected to each conductive segment. Conductive segments 106 and 108 and conductive fingers 110 through 120 can each comprise, for example, a metal or metal stack. In one embodiment, conductive segments 106 and 108 and conductive fingers 110 through 120 can comprise a conductive material other than metal.

In an embodiment of the invention, the geometry of capacitor 102 can be adjusted to adjust the capacitance value of the capacitor by changing a length of one or more conductive fingers of the capacitor. For example, the geometry of capacitor 102 can be adjusted to change its capacitance value by reducing the length of conductive finger 116 from length 126 to length 128 while leaving conductive fingers 110, 112, 114, 118, and 120 at length 126 in one embodiment. One or more conductive fingers of capacitor 102 can be trimmed in steps to achieve a desired decrease in the capacitance value of capacitor 102. For example, conductive finger 116 can be trimmed to length 128 in two steps to achieve a 4.0 percent reduction in capacitance, where each step represents a 2.0 percent reduction in capacitance.

To maintain the effectiveness of the conductive fingers, each conductive finger in capacitor 102 can be limited to a maximum reduction in length of approximately 50.0 percent in one embodiment. Thus, conductive fingers 110 through 120 can each be trimmed to approximately one half of length 126 (i.e. an untrimmed length of each conductive finger), which is indicated by dashed line 130. In one embodiment, a 10.0 percent reduction in capacitance value of capacitor 102 can be achieved by trimming conductive finger 116 to one half of its length to achieve a 6.0 percent reduction in capacitance value and by further trimming conductive finger 110 to achieve an additional 4.0 percent reduction in capacitance value. In one embodiment, a combination of conductive fingers 110 through 120 can be trimmed to achieve a maximum reduction in capacitance value of approximately 30.0 percent for capacitor 102. Also shown in FIG. 1, each of conductive fingers 110 through 120 has width 132.

Further shown in FIG. 1, capacitor 102 has dimensions 134 and 136 and consumes an area on the semiconductor die substantially equal to the product of dimensions 134 and 136. Dimensions 134 and 136 can also refer to the dimensions of standard cell 104. In the embodiment in FIG. 1, the geometry of capacitor 102 can be adjusted by changing the length of one or more of conductive fingers 110 through 120 without changing the dimensions and geometry of standard cell 104 and, consequently, without changing the die area consumed by capacitor 102. In one embodiment, capacitor 102 can be designed according to minimum design rule specifications to minimize its die area.

The fabrication of capacitor 102 will now be discussed according to an embodiment of the invention. Initially, a tape-out of a data file, such as a GDS (Graphic Data System) data file, including a layout design of an IC including capacitor 102, can be sent to a pilot foundry (also referred to as an "engineering foundry" in the present application), which can be a small-scale foundry, for design verification. The pilot foundry typically has a stringent production schedule and utilizes high quality materials. The IC including capacitor 102 can be fabricated in the pilot foundry by utilizing a set of process parameters, such as a dielectric constant value of a dielectric material and a thickness of the dielectric material. After the design has been verified in the pilot foundry, a tape-out of the data file, such as a GDS data file, can be sent to a production foundry, which can be a large-scale foundry, for mass production.

However, one of more process parameters, such as dielectric constant value, metal resistance, or dielectric material thickness, utilized in the pilot foundry can be different than the corresponding process parameters utilized in the production foundry. For an advanced process technologies, such as 40 nanometer (nm) process technology and beyond, there can be a significant difference between process parameters utilized in the pilot foundry and process parameter utilized in the production foundry. For example, the pilot foundry may utilize a low-k dielectric material having a low dielectric constant value and the production foundry may utilize a low-k dielectric material having a higher dielectric constant value. As a result of a difference in process parameters, the capacitance value of capacitor 102 can vary between the pilot foundry and the production foundry.

In a situation where a difference in process parameters causes capacitor 102 to have a higher capacitance value in the production foundry compared to the pilot foundry, the geometry of capacitor 102 in standard cell 104 can be adjusted to match the capacitance value of the capacitor resulting from fabrication in the pilot foundry. For example, the geometry of capacitor 102 can be adjusted by appropriately trimming at least one of conductive fingers 110 through 120 so as to adjust the capacitance value of capacitor 102 in the production foundry to match the capacitance value of the capacitor in the pilot foundry.

In an embodiment of the invention, the adjustment of the capacitance value of capacitor 102 can be advantageously accomplished without changing (i.e. increasing or decreasing) the die area or capacitor area of capacitor 102. Thus, the dimensions and geometry of standard cell 104 remain substantially unchanged when capacitor 102 is fabricated in the production foundry. The geometry of capacitor 102 can be adjusted by, for example, providing an automatic trimming adjustment of the layout design data file, such as the GDS data file, during tape-out to the production foundry. As such, an embodiment of the invention advantageously avoids manually redesigning the layout of the capacitor and requiring the date file to be regenerated for tape-out to the production foundry. Also, an embodiment of the invention provides an adjustment to the geometry of capacitor 102 without causing an undesirable change in the die area consumed by the capacitor. Further, adjusting the geometry of capacitor 102 in standard cell 104 can be accomplished without causing redesign or resimulation of a circuit that includes capacitor 102.

Thus, once the layout design has been verified in the pilot foundry, the layout design data file, such as a GDS data file, can be automatically offset to accommodate a difference in process parameters between the pilot foundry and a production foundry. In contrast, a conventional approach for adjusting a capacitance value of a capacitor, such as a composite capacitor, requires manually changing the layout design of the capacitor and the data file for tape-out to the production foundry, which can undesirably change the die area of the capacitor and increase manufacturing cost.

Figure 2:
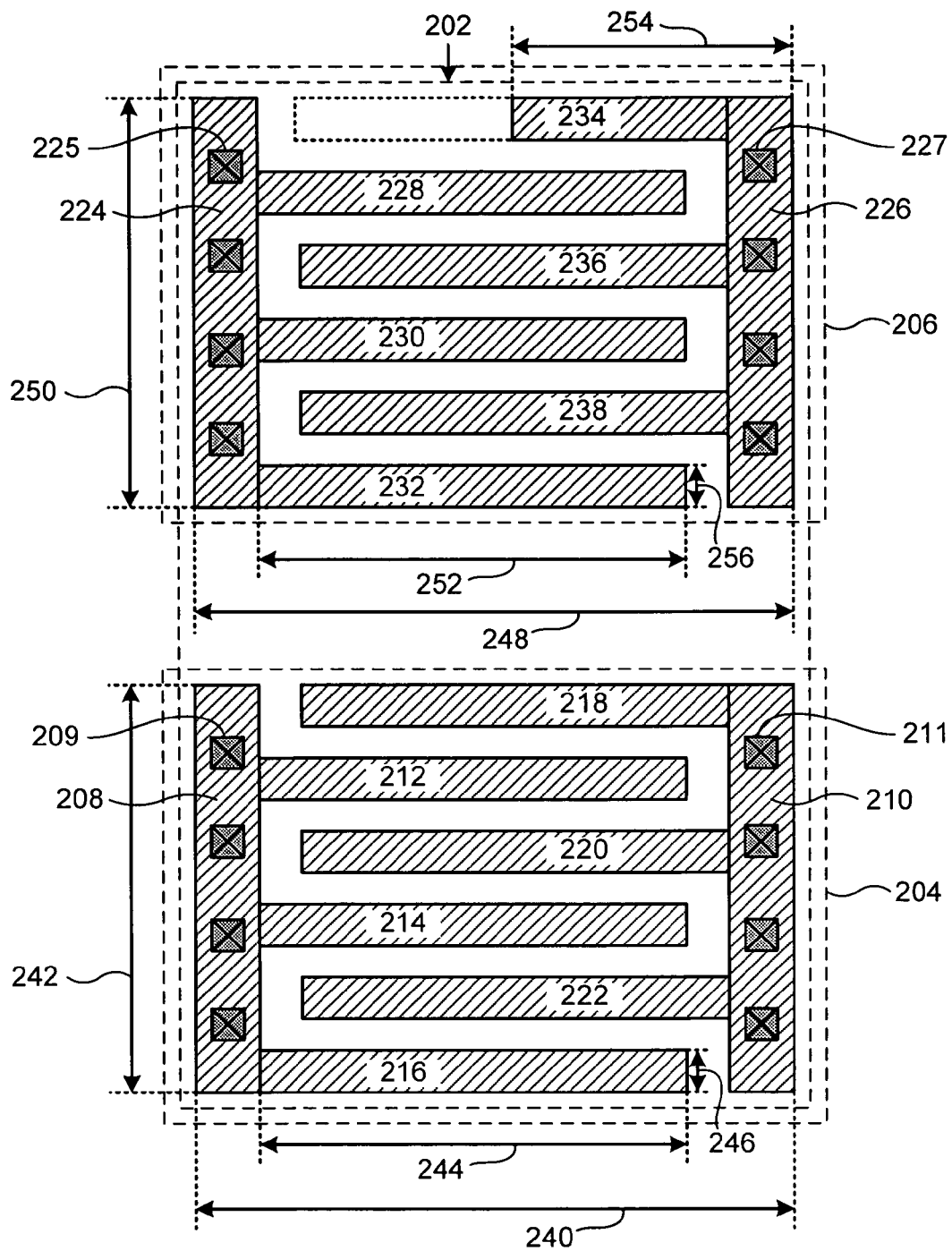
FIG. 2 shows a top view of an exemplary capacitor in different metal layers in accordance with one embodiment of the present invention.

FIG. 2 shows a top view of capacitor 202 in different metal layers in accordance with one embodiment of the present invention. In FIG. 2, capacitor 202, which can be a composite capacitor comprising several interconnected capacitors, has an initial geometry in standard cell 204. Standard cell 204 can be repeated in each of a number of metal layers up to a particular metal layer in a die to form a partially processed capacitor in a partially processed wafer. Capacitor 202 has an adjusted geometry in metal layer 206, which can be a subsequent metal layer in the die. For example, in a die having seven metal layers, capacitor 202 can have an initial geometry in standard cell 204 in M1, M2, M3, M4, M5, and M6 and an adjusted geometry in metal layer 206, which can be the seventh metal layer in the die (i.e. M7). Metal layer 206 can be, for example, a topmost metal layer when fabrication of the partially processed wafer is completed. In one embodiment, capacitor 202 can have an adjusted geometry in more than one subsequent metal layer. Each of the stacked layers of capacitor 202 can be substantially identical in orientation and dimensions.

Capacitor 202 comprises conductive segments 208 and 210 and conductive fingers 212, 214, 216, 218, 220, and 222 (hereinafter "conductive fingers 212 through 222") in standard cell 204 and conductive segments 224 and 226 and conductive fingers 228, 230, 232, 234, 236, and 238 (hereinafter "conductive fingers 228 through 238") in metal layer 206. In the embodiment in FIG. 2, capacitor 202 comprises six interlaced conductive fingers in each metal layer. In other embodiments, capacitor 202 can comprise more or less than six interlaced conductive fingers in each metal layer. Capacitor 202 can be utilized in similar semiconductor devices as capacitor 102 in FIG. 1.

As shown in FIG. 2, in standard cell 204, conductive fingers 212, 214, and 216 are electrically connected to conductive segment 208, conductive fingers 218, 220, and 222 are electrically connected to conductive segment 210, and conductive fingers 212, 214, and 216 are interlaced with conductive fingers 218, 220, and 222. Conductive segments 208 and 210 and conductive fingers 212 through 222 can each comprise, for example, a metal or metal stack. Each of conductive fingers 212 through 222 has length 244 and width 246. Capacitor 202 has an initial geometry in standard cell 204, wherein each of conductive fingers 212 through 222 has the same dimensions (i.e. each has length 244 and width 246). In standard cell 204, capacitor 202 has dimensions 240 and 242 and consumes an area on the die substantially equal to the product of dimensions 240 and 242. Dimensions 240 and 242 are also referred to as the dimensions of standard cell 204. Also shown in FIG. 2, conductive segments 208 and 210 have respective vias 209 and 211, which provide electrical connections to conductive segments in different metal layers in the die.

Further shown in FIG. 2, in metal layer 206, conductive fingers 228, 230, and 232 are electrically connected to conductive segment 224, conductive fingers 234, 236, and 238 are electrically connected to conductive segment 226, and conductive fingers 228, 230, and 232 are interlaced with conductive fingers 234, 236, and 238. Conductive segments 208 and 210 and conductive fingers 212 through 222 can each comprise, for example, a metal or metal stack. In metal layer 206, capacitor 202 has dimensions 248 and 250, which are substantially equal to respective dimensions 240 and 242 of capacitor 202 in standard cell 204. Also shown in FIG. 2, conductive segments 224 and 226 have respective vias 225 and 227, which provide electrical connections to conductive segments, such as conductive segments 208 and 210, in different metal layers in the die. One electrode of capacitor 202 includes conductive segments 208 and 224 and conductive fingers 212, 214, 216, 228, 230 and 232 and another electrode of capacitor 202 includes conductive segments 210 and 226 and conductive finger 218, 220, 222, 234, 236, and 238. Further shown in FIG. 2, conductive fingers 228, 230, 232, 236, and 238 have length 252, conductive finger 234 has length 254, and conductive fingers 228 through 232 have width 256. Length 252 is substantially equal to length 244 and width 256 is substantially equal to width 246.

In the embodiment of the invention in FIG. 2, the geometry of capacitor 202 can be adjusted in metal layer 206 to change the capacitance value of the capacitor by changing the length of conductive finger 234. For example, conductive finger 234 can be trimmed in a similar manner and with similar minimum length restrictions as discussed above with respect to capacitor 102 in FIG. 1. In other embodiments, the geometry of capacitor 202 can be adjusted in metal layer 206 to change the capacitance value by changing (i.e. increasing or decreasing) a length of at least one of conductive fingers 228 through 232 to provide a desired change in the capacitance value of capacitor 202. In other embodiments, the geometry of capacitor 202 can be adjusted in metal layer 206 to change the capacitance value by changing (i.e. reducing or increasing) a width of at least one of conductive fingers 228 through 232 to provide a desired change in the capacitance value of capacitor 202. In the embodiment in FIG. 2, conductive finger 234 can be change to length 254 to provide, for example, a reduction of approximately 8.0 percent in the capacitance value of capacitor 202.

The fabrication of capacitor 202 will now be discussed according to an embodiment of the invention. A tape-out of a data file, such as a GDS data file, including a layout design of an IC comprising including capacitor 202, can be sent to a production foundry, such as a large-scale foundry, for mass production. Capacitor 202 can be partially processed in standard cell 204 in a wafer that is partially processed up to a certain metal layer. For example, in a partially processed wafer having seven metal layers when the partially processed wafer is completed, capacitor 202 can be fabricated up to M6 (i.e. the sixth metal layer in the wafer). Feedback data can be received to indicate a need to adjust the capacitance value of capacitor 202. The feedback data can be received from a pilot foundry, for example. The feedback data can also be received, for example, from test wafers having fully processed composite capacitors. The feedback data can be further received, for example, from field use of dies having fully processed composite capacitors. For example, field use can provide feedback data that indicates that the capacitance value of a composite capacitor requires a change in a particular semiconductor device, such as a mixer or an amplifier.

In the embodiment in FIG. 2, if the feedback data indicates that the capacitance value of the partially processed composite capacitor requires a change (e.g. the capacitance value is too high or too low), the geometry of capacitor 202 can be manually adjusting in metal layer 206 by changing a length of one or more of conductive fingers 228 through 238. In the embodiment in FIG. 2, the geometry of capacitor 202 can be manually adjusted in metal layer 206 without changing dimensions 248 and 250 of capacitor 202 in metal layer 206 with respect to dimensions 240 and 242 of capacitor 202 in standard cell 204. Thus, the capacitance value of capacitor 202 can be adjusted by adjusting the geometry of capacitor 202 in metal layer 206 without changing the die area of capacitor 202 in standard cell 204. In contrast to the embodiment of the invention in FIG. 1, the embodiment in FIG. 2 requires the geometry of the capacitor to be manually adjusted to adjust the capacitance value. Except for the above requirement, the embodiment in FIG. 2 can provide similar advantages as the embodiment in FIG. 1.

Figure 3:
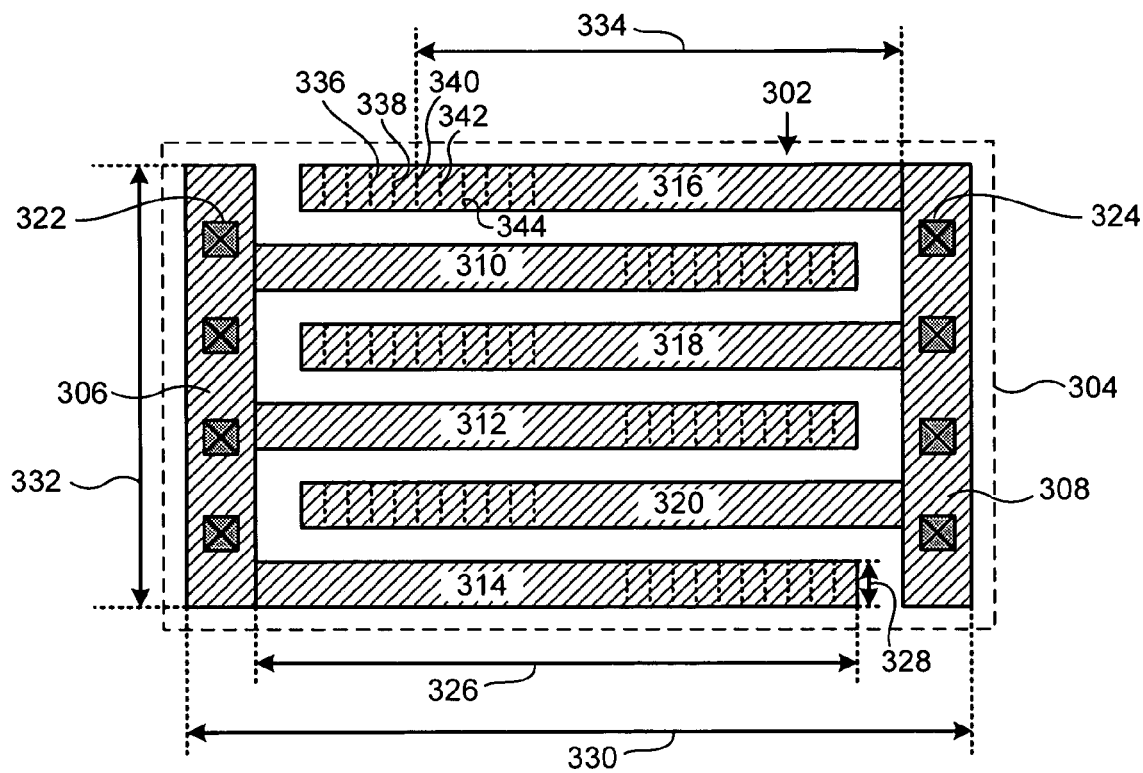
FIG. 3 shows a top view of an exemplary capacitor in an exemplary standard cell in accordance with one embodiment of the present invention.

FIG. 3 shows a top view of capacitor 302 in standard cell 304 in accordance with one embodiment of the present invention. In FIG. 3, capacitor 302, which can be a composite capacitor comprising several interconnected capacitors, is shown in standard cell 304 in one metal layer in a die. However, standard cell 304 can be repeated in multiple metal layers in a die in a similar manner as discussed above with respect to capacitor 102 in FIG. 1. Each of the stacked layers of capacitor 302 can be substantially identical in geometry, orientation, and dimensions and can be electrically connected to each other by vias to form a composite capacitor. Capacitor 302 includes conductive segments 306 and 308 and conductive fingers 310, 312, 314, 316, 318, and 320 (hereinafter "conductive fingers 310 through 320"). In the embodiment in FIG. 3, capacitor 302 includes six interlaced conductive fingers. In other embodiments, capacitor 302 can include less than or more than six interlaced conductive fingers.

As shown in FIG. 3, conductive fingers 310, 312, and 314 are electrically connected to conductive segment 306, conductive fingers 316, 318, and 320 are electrically connected to conductive segment 308, and conductive fingers 310, 312, and 314 are interlaced with conductive fingers 316, 318, and 320. Conductive segments 306 and 308 and conductive fingers 310 through 320 can comprise, for example, a metal or metal stack. In capacitor 302, one electrode includes conductive segment 306 and conductive fingers 310, 312, and 314 and another electrode includes conductive segment 308 and conductive fingers 316, 318, and 320.

Also shown in FIG. 3, conductive segments 306 and 308 include respective vias 322 and 324, which provide electrical connections to conductive segments in different metal layers in the die. Further shown in FIG. 3, each of conductive fingers 310 through 320 has maximum length 326 and width 328. Also shown in FIG. 3, capacitor 302 has dimensions 330 and 332 and consumes an area on the semiconductor die substantially equal to the product of dimensions 330 and 332, which also refer to the dimensions of standard cell 304. In the embodiment of the invention in FIG. 3, the geometry of capacitor 302 can be adjusted to change the capacitance value of capacitor 302 by appropriately changing (i.e. increasing or decreasing) the length of one or more of conductive fingers 310 through 320, as discussed below.

The fabrication of capacitor 302 will now be discussed according to an embodiment of the invention. Initially, a tape-out of a data file, such as a GDS data file, including a layout design of an IC including capacitor 302, can be sent to a pilot foundry, which can be a small-scale foundry, for design verification. Capacitor 302 can be sent to the pilot foundry having each of conductive fingers 310 through 320 at initial length 334 (as indicated by dashed line 340) in a standard cell having dimensions 330 and 332. A wafer including the composite capacitor can be fabricated in the pilot foundry by utilizing a first set process parameters, which can include a dielectric constant of the dielectric material and a thickness of the dielectric material. After the design has been verified at the pilot foundry, a tape-out of the data file, such as a GDS data file, can be sent to a production foundry, which can be a large-scale foundry, for mass production.

The production foundry can utilize a second set of process parameters that are different than the first set of process parameters utilized in the pilot foundry, which can cause a corresponding difference in the capacitance value of the capacitor. If the dielectric constant of the dielectric material utilized in the pilot foundry is lower than the dielectric constant of the dielectric material utilized in the production foundry, the capacitance value of the capacitance will be higher in the production foundry, and vice versa. In the embodiment in FIG. 3, the geometry of capacitor 302 can be adjusted to adjust the capacitance value of capacitor 302 by appropriately changing the length of one or more of conductive fingers 310 through 320 from length 334. For example, to increase the capacitance value of capacitor 302, the length of one or more of conductive fingers 310 through 320 can be increased to a length indicated by dashed line 336 or 338. For example, to decrease the capacitance value of capacitor 302, the length of one or more of conductive fingers 310 through 320 can be reduced to a length as indicated by dashed line 342 and 344.

In the embodiment in FIG. 3, a change in the capacitance value of capacitor 302 can be accomplished without changing (e.g. increasing or decreasing) the die area or capacitor area of capacitor 302 from pilot to production foundries by providing an automatic trimming adjustment to the layout design data file, such as the GDS data file, during tape-out to the production foundry. Similar to the embodiment in FIG. 1, the embodiment in FIG. 3 also advantageously avoids manual changes to the layout design of the capacitor and regeneration of the data file, such as the GDS data file, for tape-out to the production foundry. However, in contrast to the embodiment in FIG. 1, the embodiment in FIG. 3 allows the geometry of capacitor 302 to be adjusted to decrease or increase the capacitance value of the capacitor as required to cause the capacitor value in the production foundry to be substantially the same as the capacitance value in the pilot foundry. However, to be able to increase the capacitance of the composite capacitor in the production foundry, standard cell 304 in FIG. 3 requires a larger die area than standard cell 104 in the embodiment in FIG. 1.

Figure 4:
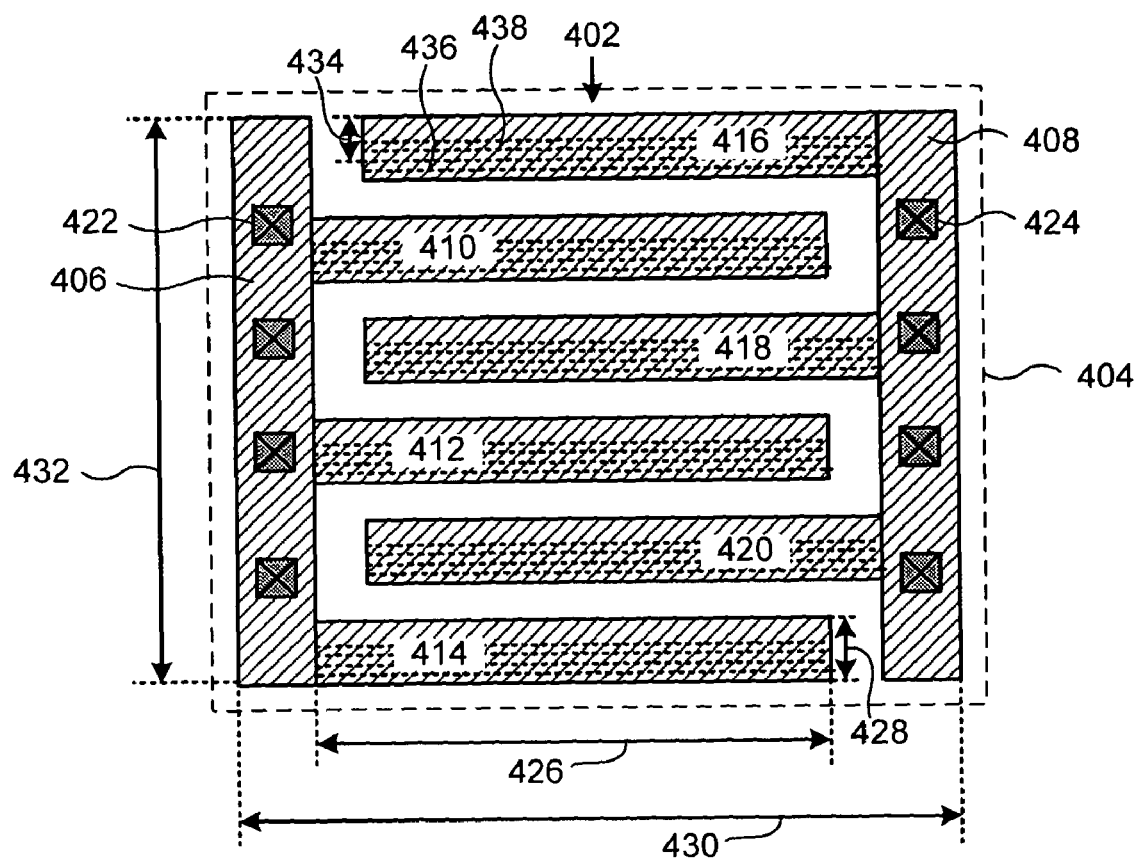
FIG. 4 shows a top view of an exemplary capacitor in an exemplary standard cell in accordance with one embodiment of the present invention.

FIG. 4 shows a top view of capacitor 402 in standard cell 404 in accordance with one embodiment of the present invention. In FIG. 4, capacitor 402, which can be a composite capacitor comprising several interconnected capacitors, is shown in standard cell 404 in one metal layer in a die. However, standard cell 404 can be repeated in multiple metal layers in a die in a similar manner as discussed above with respect to capacitor 102 in FIG. 1. Each of the stacked layers of capacitor 402 can be substantially identical in geometry, orientation, and dimensions and can be electrically connected to each other by vias to form a composite capacitor. Capacitor 402 includes conductive segments 406 and 408 and conductive fingers 410, 412, 414, 416, 418, and 420 (hereinafter "conductive fingers 410 through 420"). In the embodiment in FIG. 4, capacitor 402 includes six interlaced conductive fingers. In other embodiments, capacitor 402 can include less than or more than six interlaced conductive fingers.

As shown in FIG. 4, conductive fingers 410, 412, and 414 are electrically connected to conductive segment 406, conductive fingers 416, 418, and 420 are electrically connected to conductive segment 408, and conductive fingers 410, 412, and 414 are interlaced with conductive fingers 416, 418, and 420. Conductive segments 406 and 408 and conductive fingers 410 through 420 can comprise, for example, a metal or metal stack. In capacitor 402, one electrode includes conductive segment 406 and conductive fingers 410, 412, and 414 and another electrode includes conductive segment 408 and conductive fingers 416, 418, and 420.

Also shown in FIG. 4, conductive segments 406 and 408 have respective vias 422 and 424, which provide electrical connections to conductive segments in different metal layers in the die. Further shown in FIG. 4, conductive fingers 410 through 420 each has length 426 and maximum width 428. Also shown in FIG. 4, capacitor 402 has dimensions 430 and 432 and consumes an area on the semiconductor die substantially equal to the product of dimensions 430 and 432, which also refer to the dimensions of standard cell 404. In the embodiment of the invention in FIG. 4, the geometry of capacitor 402 can be adjusted to change the capacitance value of capacitor 402 by appropriately changing (i.e. increasing or decreasing) a width of one or more of conductive fingers 410 through 420, as discussed below.

The fabrication of capacitor 402 will now be discussed according to an embodiment of the invention. Initially, a tape-out of a data file, such as a GDS data file, including a layout design of an IC including capacitor 402, can be sent to a pilot foundry, which can be a small-scale foundry, for design verification. Capacitor 402 can be sent to the pilot foundry having each of conductive fingers 410 through 420 at initial width 434 in a standard cell having dimensions 430 and 432. A wafer including the composite capacitor can be fabricated in the pilot foundry by utilizing a first set process parameters, which can include a dielectric constant of the dielectric material and a thickness of the dielectric material. After the design has been verified at the pilot foundry, a tape-out of the data file, such as a GDS data file, can be sent to a production foundry, which can be a large-scale foundry, for mass production.

The production foundry can utilize a second set of process parameters that are different than the first set of process parameters utilized in the pilot foundry, which can cause a corresponding change in the capacitance value of the composite capacitor. If the dielectric constant of the dielectric material utilized in the pilot foundry is lower than the dielectric constant of the dielectric material utilized in the production foundry, the capacitance value of the capacitor can be higher in the production foundry, and vice versa. In the embodiment in FIG. 4, the geometry of capacitor 402 can be adjusted to adjust the capacitance value by appropriately changing (i.e. increasing or decreasing) the width of one or more of conductive fingers 410 through 420 from initial width 434. For example, to increase the capacitance value of capacitor 402, the width of one or more of conductive fingers 410 through 420 can be increased to a width indicated by dashed line 436. For example, to decrease the capacitance value of capacitor 402, the width of one or more of conductive fingers 410 through 420 can be decreased to a width indicated by dashed line 438.

In the embodiment in FIG. 4, a change in the capacitance value of capacitor 402 can be accomplished without changing (e.g. increasing or decreasing) the die area or capacitor area of capacitor 402 from pilot to production foundries by providing an automatic adjustment to the layout design data file, such as the GDS data file, during tape-out to the production foundry. Similar to the embodiment in FIG. 1, the embodiment in FIG. 4 also advantageously avoids manual changes to the layout design of the capacitor and regeneration of the data file, such as the GDS data file, for tape-out to the production foundry. However, in contrast to the embodiment in FIG. 1, the embodiment in FIG. 4 allows the geometry of capacitor 402 to be adjusted to decrease or increase the capacitance of the capacitor as required to cause the capacitance value of the capacitor in the production foundry to be substantially the same as the capacitance value of the capacitor in pilot foundry. However, to be able to increase the capacitance value of capacitor 402 in the production foundry, standard cell 404 in FIG. 4 can consume a larger die area than standard cell 104 in the embodiment in FIG. 1.

Figure 5:
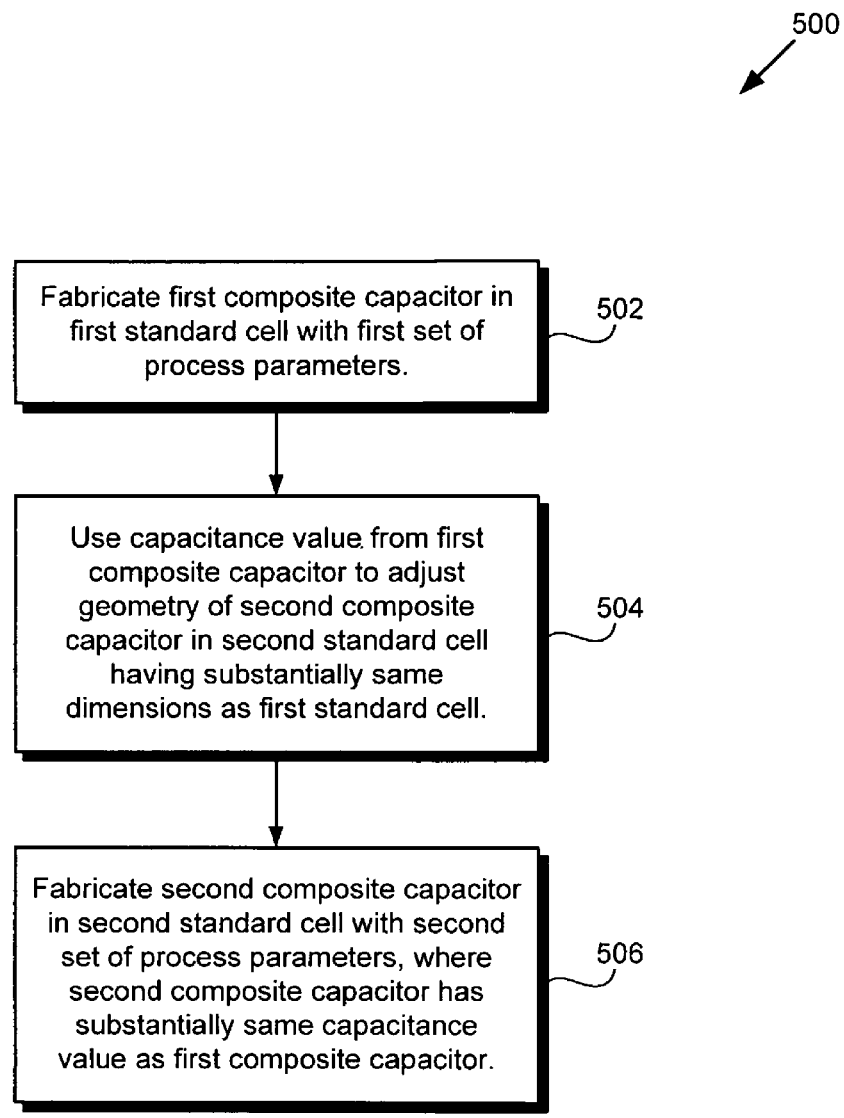
FIG. 5 shows a flowchart illustrating an exemplary method for adjusting a geometry of a capacitor in accordance with one embodiment of the present invention.

FIG. 5 shows a flowchart illustrating an exemplary method for adjusting geometry of a capacitor, such as a composite capacitor, according to one embodiment of the present invention. Certain details and features have been left out of flowchart 500 that are apparent to a person of ordinary skill in the art. For example, a step may consist of one or more substeps or may involve specialized equipment or materials, as known in the art. At step 502 of flowchart 500, a first composite capacitor in a first standard cell is fabricated with a first set of process parameters. For example, capacitor 102 in standard cell 104 in FIG. 1 can be fabricated with each of conductive fingers 110 through 120 at length 126 with a first set of process parameters in a pilot foundry in one embodiment.

At step 504 of flowchart 500, a capacitance value from the first composite capacitor is used to adjust the geometry of a second composite capacitor in a second standard cell having substantially the same dimensions as the first standard cell. For example, a capacitance value from a composite capacitor in a standard cell having each of conductive fingers 110 through 120 in FIG. 1 at length 126 and having dimensions substantially equal to dimensions 134 and 136 can be fabricated in the pilot foundry and can be used to adjust the geometry of capacitor 102 in standard cell 104 for fabrication in a production foundry using a second set of process parameters. For example, the geometry of capacitor 102 can be adjusted by changing a length of at least one of conductive fingers 110 through 120.

At step 506, the second composite capacitor is fabricated in a second standard cell with a second set of process parameters, where the second composite capacitor has substantially a same capacitance value as the first composite capacitor. For example, the length of conductive finger 116 can be changed from length 126 to length 128 and capacitor 102 in standard cell 104 can be fabricated using the second set of process parameters in the production foundry so as to cause capacitor 102 to have substantially the same capacitance value as capacitor 102 (i.e. the first composite capacitor) had when fabricated using the first set of process parameters in the pilot foundry with conductive fingers 110 through 120 each having length 126. In an embodiment of the invention, the total area (i.e. the die size) of capacitor 102 can remain substantially the same in standard cell 104 after the geometry of capacitor 102 has been adjusted.

Figure 6:
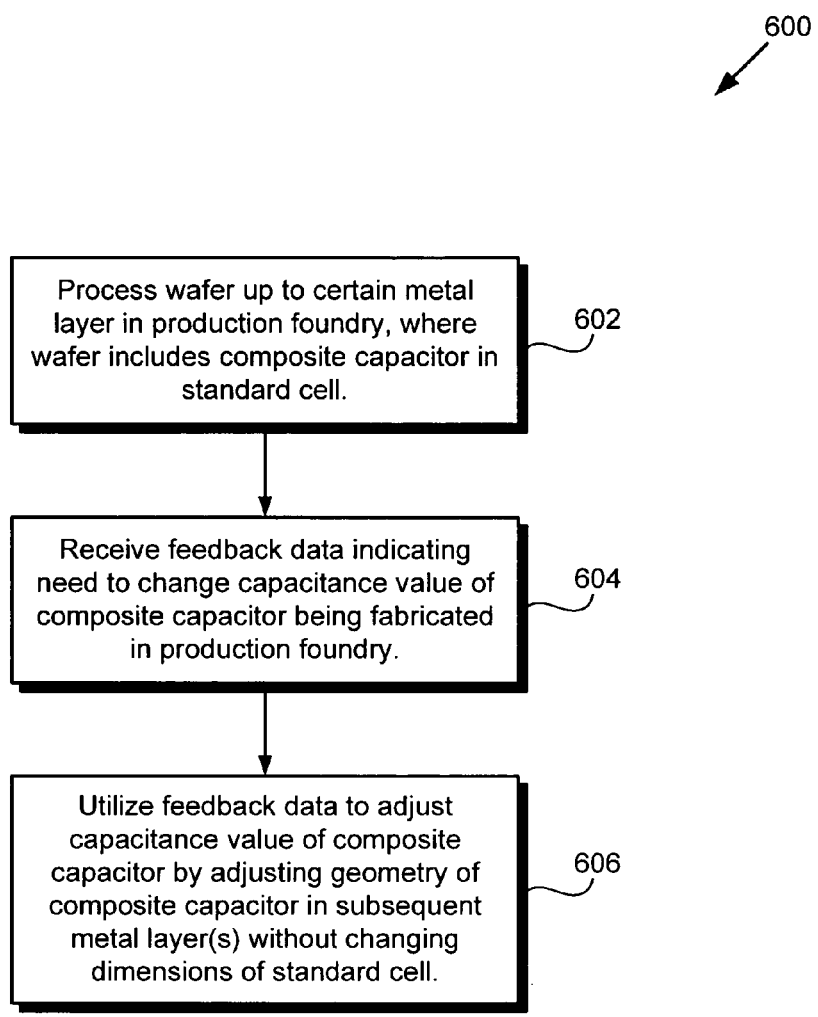
FIG. 6 shows a flowchart illustrating an exemplary method for adjusting a capacitance value of a capacitor in accordance with one embodiment of the present invention.

FIG. 6 shows a flowchart illustrating an exemplary method for adjusting a capacitance value of a partially processed composite capacitor of a standard cell in a partially processed wafer in a production foundry according to one embodiment of the present invention. Certain details and features have been left out of flowchart 600 that are apparent to a person of ordinary skill in the art. For example, a step may consist of one or more substeps or may involve specialized equipment or materials, as known in the art. At step 602 of flowchart 600, a wafer is processed up to a certain metal layer in a first foundry, where the wafer includes a composite capacitor in a standard cell. For example, a partially processed wafer including a partially processed capacitor in standard cell 204 can be processed up to a metal layer immediately below metal layer 206 in a production foundry. Metal layer 206 can be, for example, a topmost metal layer when fabrication of the partially processed wafer is completed. For example, if metal layer 206 is M7 (i.e. a seventh metal layer in the wafer), capacitor 202 in standard cell 204 can be processed up to M6. Capacitor 202 in standard cell 204 can include conductive fingers 212 through 222, where each conductive finger has length 244.

At step 604, feedback data is received indicating a need to change the capacitance value of the composite capacitor being fabricated in the production foundry. The feedback data can be received from a pilot foundry, for example. The feedback data can also be received, for example, from test wafers having fully processed composite capacitors. The feedback data can be further received, for example, from field use of dies having fully processed composite capacitors. For example, field use can provide feedback data that indicates that the capacitance value of a composite capacitor requires a change in a particular semiconductor device, such as a mixer or an amplifier.

At step 606, the feedback data is utilized to adjust the capacitance value of the composite capacitor by adjusting a geometry of the composite capacitor in a subsequent metal layer(s) without changing the dimensions of the standard cell. For example, the feedback data can be utilized to adjust the capacitance value of capacitor 202 by adjusting a length of one or more of conductive fingers 228 through 238 in metal layer 226 without changing dimensions 240 and 242 of standard cell 204. In an embodiment of the invention in FIG. 2, dimensions 248 and 250 of capacitor 202 in metal layer 206 are substantially equal to respective dimensions 240 and 242 of standard cell 204. In one embodiment, the feedback data can be utilized to change the capacitance value of a composite capacitor, such as capacitor 302 in FIG. 3, by changing (i.e. increasing or decreasing) a length of at least one conductive finger in the subsequent metal layer. In one embodiment, the feedback data can be utilized to change the capacitance value of a composite capacitor, such as capacitor 402 in FIG. 4, by changing (i.e. increasing or decreasing) a width of at least one conductive finger in the subsequent metal layer.

Thus, as discussed above, the invention provides a method for adjusting a capacitance value of a capacitor, such as a composite capacitor, by adjusting a geometry of the capacitor without increasing die area. The capacitance value of the capacitor can be advantageously adjusted without requiring a manual change in layout design of the capacitor or regeneration of a data file, such as GDS data file, for tape-out to a production foundry. The invention also provides a method for adjusting a capacitance value of a partially processed composite capacitor of a standard cell in a partially processed wafer in a production foundry without changing dimensions of the standard cell.

From the above description of the invention it is manifest that various techniques can be used for implementing the concepts of the present invention without departing from its scope. Moreover, while the invention has been described with specific reference to certain embodiments, a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A method comprising:
   fabricating a first composite capacitor residing in a first standard cell with a first set of process parameters;
   using a second standard cell having substantially same dimensions as said first standard cell;
   using a capacitance value from said first composite capacitor to adjust a geometry of a second composite capacitor residing in said second standard cell, wherein said second composite capacitor is fabricated with a second set of process parameters.

2. The method of claim 1, wherein said geometry of said second composite capacitor is adjusted to cause said second composite capacitor to have a capacitance value substantially equal to said capacitance value of said first composite capacitor.

3. The method of claim 1, wherein said first composite capacitor comprises a plurality of interlaced conductive fingers having a same length.

4. The method of claim 1, wherein said second composite capacitor comprises a plurality of interlaced conductive fingers.

5. The method of claim 4, wherein said geometry of said second composite capacitor is adjusted by reducing a length of at least one of said plurality of interlaced conductive fingers.

6. The method of claim 4, wherein said geometry of said second composite capacitor is adjusted by increasing a length of at least one of said plurality of , interlaced conductive fingers.

7. The method of claim 1, wherein said first composite capacitor comprises a plurality of interlaced conductive fingers having a same width.

8. The method of claim 4, wherein said geometry of said second composite capacitor is adjusted by reducing a width of at least one of said plurality of interlaced conductive fingers.

9. The method of claim 4, wherein said geometry of said second composite capacitor is adjusted by increasing a width of at least one of said plurality of interlaced conductive fingers.

10. The method of claim 1, wherein using said capacitance value from said first composite capacitor to adjust said geometry of said second composite capacitor does not cause a change in a geometry and dimensions of said second standard cell.

11. A method comprising:
    fabricating a first composite capacitor residing in a first standard cell with a first set of process parameters;
    using a second standard cell having substantially same dimensions as said first standard cell;
    using a capacitance value from said first composite capacitor to adjust a geometry of a second composite capacitor residing in said second standard cell.

12. The method of claim 11, wherein said geometry of said second composite capacitor is adjusted to cause said second composite capacitor to have a capacitance value substantially equal to said capacitance value of said first composite capacitor.

13. The method of claim 11, wherein said first composite capacitor comprises a plurality of interlaced conductive fingers.

14. The method of claim 11, wherein said second composite capacitor comprises a plurality of interlaced conductive fingers.

15. The method of claim 14, wherein said geometry of said second composite capacitor is adjusted by reducing a length of at least one of said plurality of interlaced conductive fingers.

16. The method of claim 14, wherein said geometry of said second composite capacitor is adjusted by increasing a length of at least one of said plurality of interlaced conductive fingers.

17. The method of claim 14, wherein said geometry of said second composite capacitor is adjusted by reducing a width of at least one of said plurality of interlaced conductive fingers.

18. The method of claim 14, wherein said geometry of said second composite capacitor is adjusted by increasing a width of at least one of said plurality of interlaced conductive fingers.

19. The method of claim 11, wherein using said capacitance value from said first composite capacitor to adjust said geometry of said second composite capacitor does not cause a change in dimensions of said second standard cell.

* * * * *